(12) United States Patent
Iwase

(10) Patent No.: US 9,166,248 B2
(45) Date of Patent: Oct. 20, 2015

(54) MANUFACTURING METHOD OF BATTERY PACK

(71) Applicant: Kosuke Iwase, Nagoya (JP)

(72) Inventor: Kosuke Iwase, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 214 days.

(21) Appl. No.: 14/065,705

(22) Filed: Oct. 29, 2013

(65) Prior Publication Data

US 2014/0123472 A1    May 8, 2014

(30) Foreign Application Priority Data

Nov. 6, 2012   (JP) .................................. 2012-244747

(51) Int. Cl.
| | |
|---|---|
| *H01M 6/00* | (2006.01) |
| *H01M 10/04* | (2006.01) |
| *H01M 10/42* | (2006.01) |
| *G01R 31/02* | (2006.01) |
| *G01R 31/36* | (2006.01) |

(52) U.S. Cl.
CPC ...... *H01M 10/0468* (2013.01); *H01M 10/4207* (2013.01); *G01R 31/025* (2013.01); *G01R 31/36* (2013.01); *H01M 10/42* (2013.01); *H01M 10/4214* (2013.01); *H01M 10/4285* (2013.01); *Y10T 29/49004* (2015.01); *Y10T 29/49108* (2015.01)

(58) Field of Classification Search
CPC ............ H01M 10/42; H01M 10/4207; H01M 10/4214; H01M 10/0468; H01M 10/4285; G01R 31/025; G01R 31/36; G01R 31/3641; Y10T 29/49004; Y10T 29/49108
USPC .............. 29/592.1, 593, 623.1; 324/426, 429; 429/90

See application file for complete search history.

(56) References Cited

U.S. PATENT DOCUMENTS

| | | | | |
|---|---|---|---|---|
| 4,282,292 | A * | 8/1981 | Stewart ........................... | 429/93 |
| 8,163,409 | B2 * | 4/2012 | Fujikawa et al. ............... | 429/61 |
| 8,802,260 | B2 * | 8/2014 | Nakanishi et al. ............. | 429/93 |
| 9,005,838 | B2 * | 4/2015 | Uehara et al. ................. | 429/469 |
| 2001/0019270 | A1 | 9/2001 | Onishi et al. | |
| 2008/0186029 | A1 * | 8/2008 | Nishino et al. ................ | 324/426 |

FOREIGN PATENT DOCUMENTS

JP     A-2001-236985     8/2001

* cited by examiner

*Primary Examiner* — Paul D Kim

(74) *Attorney, Agent, or Firm* — Oliff PLC

(57) ABSTRACT

A manufacturing method of a battery pack includes a restraining process of restraining single cells at a maximum restraint contact pressure Pd of the battery pack in a complete state, after compressing the single cells at a maximum compression contact pressure Pc that satisfies $0.8 \leq Pd/Pc \leq 0.9$, with respect to the maximum restraint contact pressure Pd; a standing process of then leaving the single cells to stand for a predetermined number of days in an electrically open state; and a short-circuit testing process of then testing for an internal short in the single cells.

4 Claims, 6 Drawing Sheets

MANUFACTURING METHOD OF BATTERY PACK

INCORPORATION BY REFERENCE

The disclosure of Japanese Patent Application No 2012-244747 filed on Nov. 6, 2012 including the specification, drawings and abstract is incorporated herein by reference in its entirety.

BACKGROUND OF THE INVENTION

1. Field of the Invention

The invention relates to a manufacturing method of a battery pack that includes a plurality of single cells each having an electrode body that includes an electrode plate and a separator, and a restraining member that restrains the single cells.

2. Description of Related Art

A battery pack is known in which a plurality of single cells are stacked directly or alternately via spacers, and the restrained by a restraining member.

Normally, when a battery Pack is assembled, the assembled single cells are supercompressed in the stacking direction beforehand to improve workability. This is because workability is improved when the single cells are restrained by a restraining member or the like, as a result of the dimension (thickness) of the single cells being reduced beforehand by supercompressing them. More specifically, in a battery pack in a complete state, the highest maximum contact pressure, of pressure that is applied in the thickness direction of the separator and the electrode plate that form the electrode body housed in the single cells by the restraining member and is distributed in the spreading direction of the separator and the electrode plate, is the maximum restraint contact pressure. After the single cells are supercompressed at a compression contact pressure that is sufficiently larger than this maximum restraint contact pressure, for example, several times larger than the maximum restraint contact pressure, the battery pack in which these supercompressed single cells are restrained by the restraining member is assembled. Finally, an adjustment is made such that the maximum restraint contact pressure is applied to each of the single cells while the battery pack is in the complete state.

As described in Japanese Patent Application Publication No. 2001-236985 (JP 2001-236985 A), it is expected that when conductive foreign matter present in the electrode body of a single cell is large enough to possibly cause a short when the battery pack is stored or used in the future, this foreign matter may pass through the separator when the single cell is supercompressed at the compression contact pressure, and a positive electrode plate and a negative electrode plate of the single cell may become electrically connected via this foreign matter, causing a short. Therefore, with such a battery, it is conceivably possible to differentiate a single cell in which a short may occur by a test in a short period of time and remove the single cell.

However, it is now known that when conductive foreign matter is small, a short will not occur in the future even if such small foreign matter is present in the electrode body, even if the maximum restraint contact pressure described above continues to be applied. However, if the compression contact pressure described above is too high, even if the conductive foreign matter is small, it will damage the separator. It is also know known that if an extended period of time passes while the battery pack is in a state in which the maximum restraint contact pressure is applied to such damaged single cells (i.e., if the single cells that are damaged in this way continue to be restrained by the restraining member at the maximum restraint contact pressure), the foreign matter may pass through the separator, and the positive and negative electrode plates may become electrically connected via this foreign matter, causing a short. However, to eliminate this, a short circuit test must be performed for an extended period of time after the battery pack is assembled, which is unrealistic.

SUMMARY OF THE INVENTION

The invention provides a manufacturing method of a battery pack that improves workability when assembling the battery pack, and enables only a single cell in which a short may occur in the future due to conductive foreign matter, to be differentiated in a short period of time and removed.

A first aspect of the invention relates to a manufacturing method of a battery pack that includes a plurality of single cells, each of which has an electrode body that includes an electrode plate and a separator, and a restraining member that restrains the single cells. This manufacturing method includes a restraining process of restraining the single cells in a thickness direction of the electrode plate and the separator at a maximum restraint contact pressure Pd, after compressing the single cells in the thickness direction at a maximum compression contact pressure Pc that satisfies $0.8 \leq Pd/Pc \leq 0.9$, when a highest maximum contact pressure, of a pressure that is applied in the thickness direction by the restraining member and distributed in a spreading direction of the electrode plate and the separator, is set as the maximum restraint contact pressure Pd, in the battery pack in a complete state; a standing process of leaving the single cells that are in the state restrained at the maximum restraint contact pressure Pd to stand for a predetermined number of days in an electrically open state after the restraining process; and a short-circuit testing process of testing for an internal short in the single cells that are left standing in the state restrained at the maximum restraint contact pressure Pd after the standing process.

In this manufacturing method of a battery pack, after the single cells have been compressed at the maximum compression contact pressure Pc that is slightly higher than the maximum restraint contact pressure Pd that satisfies $0.8 \leq Pd/Pc \leq 0.9$, with respect to the maximum restraint contact pressure Pd of the battery pack in the complete state, the single cells are restrained at the maximum restraint contact pressure Pd, left in an electrically open state, and tested for an internal short. The single cells are able to be sufficiently compressed beforehand by setting the maximum compression contact pressure Pc to a value larger than the maximum restraint contact pressure Pd that satisfies $Pd/Pc \leq 0.9$, i.e., $Pc \geq 1.11$ Pd. Therefore, workability when assembling the battery pack is able to be improved at times such as when restraining the single cells with the restraining member. In addition, with a single cell in which large conductive foreign matter that may cause a short in the future is in the electrode body, this foreign matter passes through the separator when the single cell is compressed, and the positive electrode plate and the negative electrode plate become electrically connected via this foreign matter. Consequently, a short occurs. Therefore, the number of days for which the single cells are left standing in the standing process is able to be reduced, so a single cell in which a short has occurred can be differentiated in a short period of time and removed.

On the other hand, for a single cell in which there is only small foreign matter that will not cause a short in the future if only the maximum restraint contact pressure Pd continues to be applied, the small foreign matter can be inhibited from damaging the separator when the single cell is compressed with the maximum compression contact pressure Pc, which is a value that satisfies Pd/Pc≥0.8, i.e., Pc≤1.25 Pd, as an upper limit. As a result, even if the maximum restraint contact pressure Pd continues to be applied in the completed battery pack, a short is able to be prevented from occurring due to small foreign matter passing through the separator. Therefore, there is no need to perform a short-circuit test for an extended period of time after the single cells have been restrained at the maximum restraint contact pressure Pd. In this way, this manufacturing method makes it possible to both improve workability when assembling a battery pack, and differentiate in a short period of time only those single cells in which a short may occur in the future due to conductive foreign matter and remove them.

The number of days for which the single cells are left standing may be 1.5 to 3.0 days, inclusive.

Accordingly, the period of time required to perform the short-circuit test in the manufacture of the batter pack is able to be notably reduced.

The maximum restraint contact pressure Pd may be 0.3 to 15.5 MPa, inclusive.

In a battery pack in which the maximum restraint contact pressure Pd is 0.3 to 15.5 MPa, inclusive, by applying the maximum compression contact pressure Pc that is slightly higher than this maximum restraint contact pressure Pd, an effect is able to be suitably obtained in which workability when assembling the battery pack is able to be improved, and only a single cell in which a short may occur in the future due to conductive foreign matter is able to be differentiated by a short-circuit test in a short period of time.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
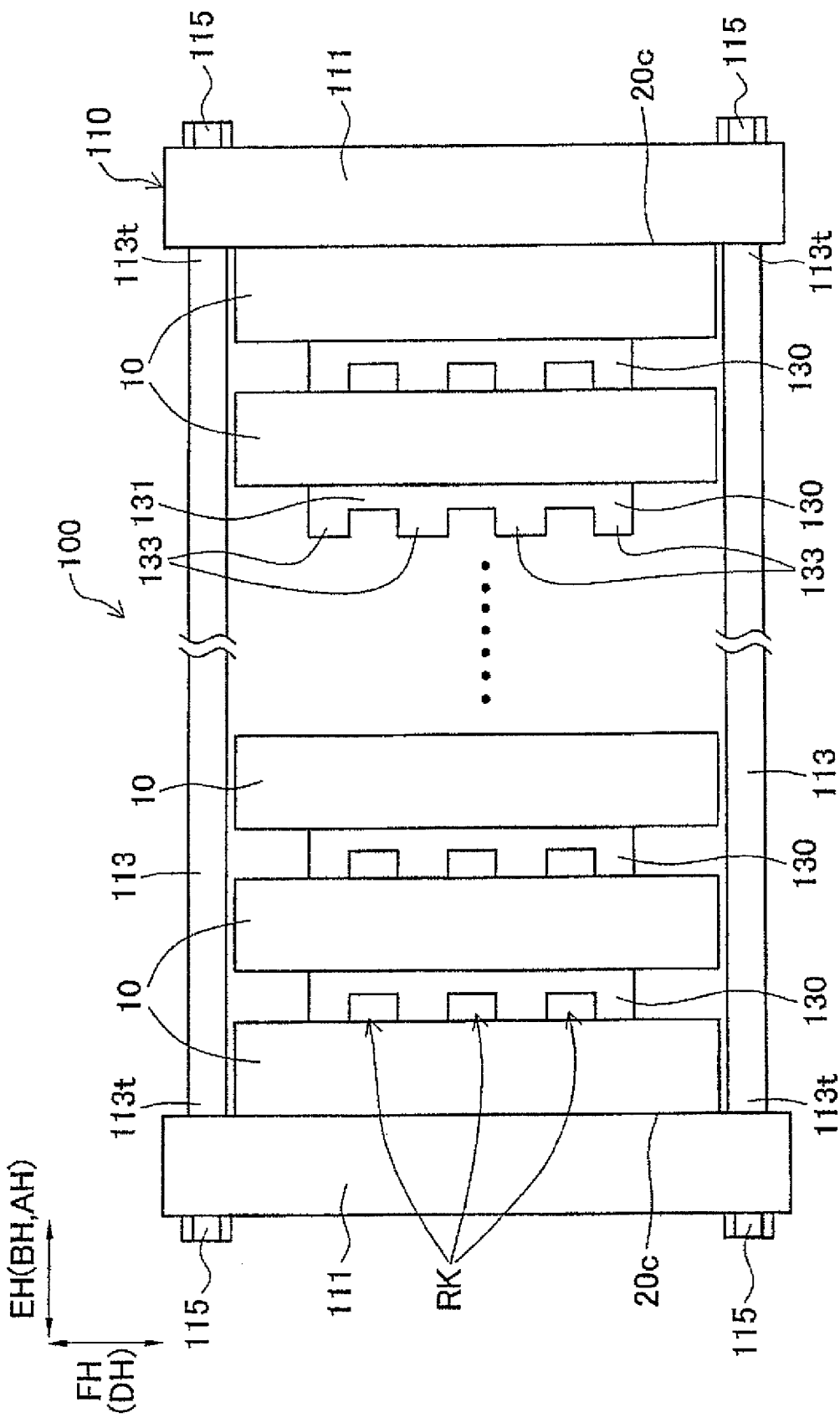
FIG. 1 is a side view of a battery pack according to one example embodiment of the invention.
Figure 2:
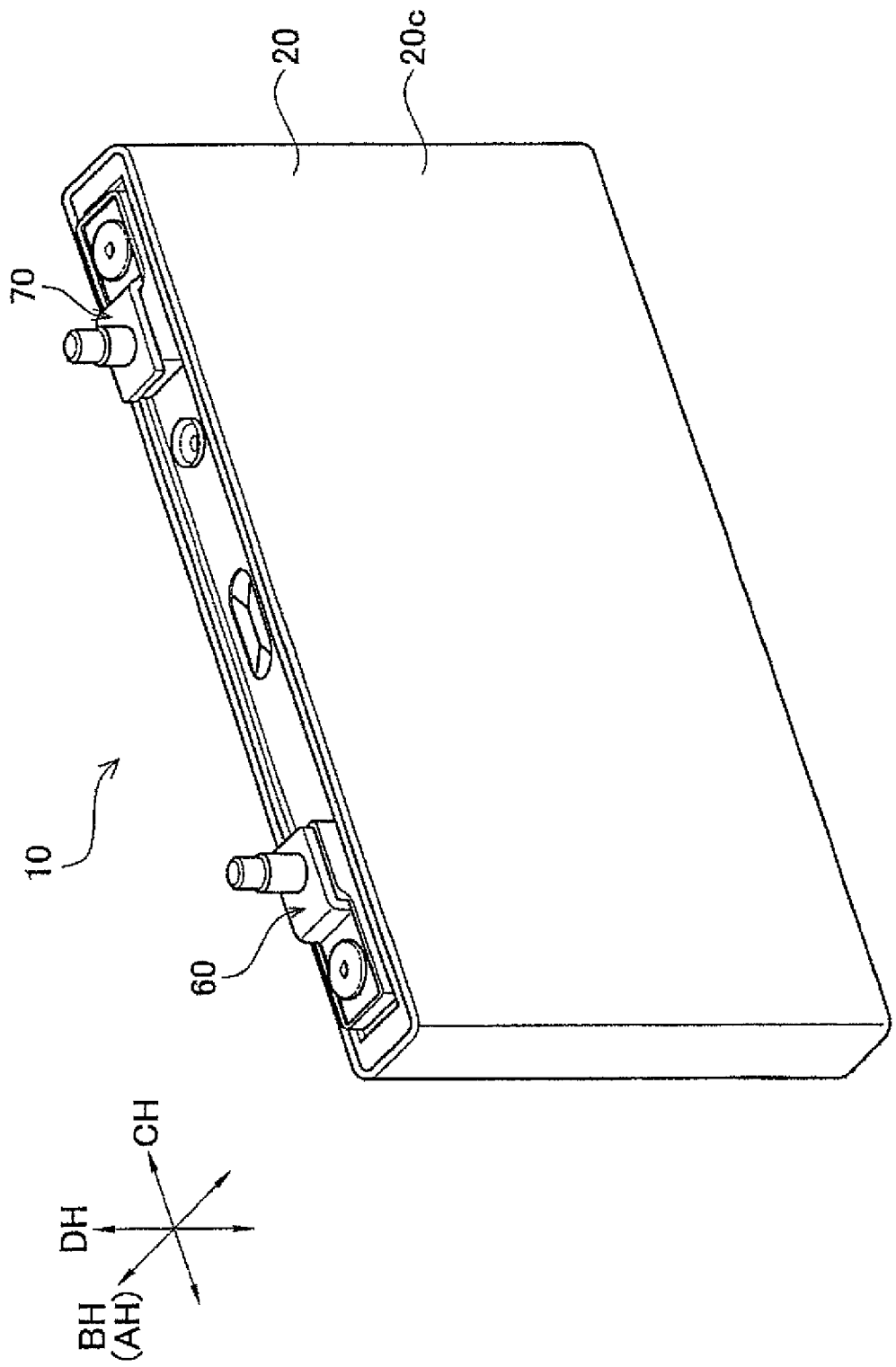
FIG. 2 is a perspective view of a single cell according to the example embodiment.
Figure 3:
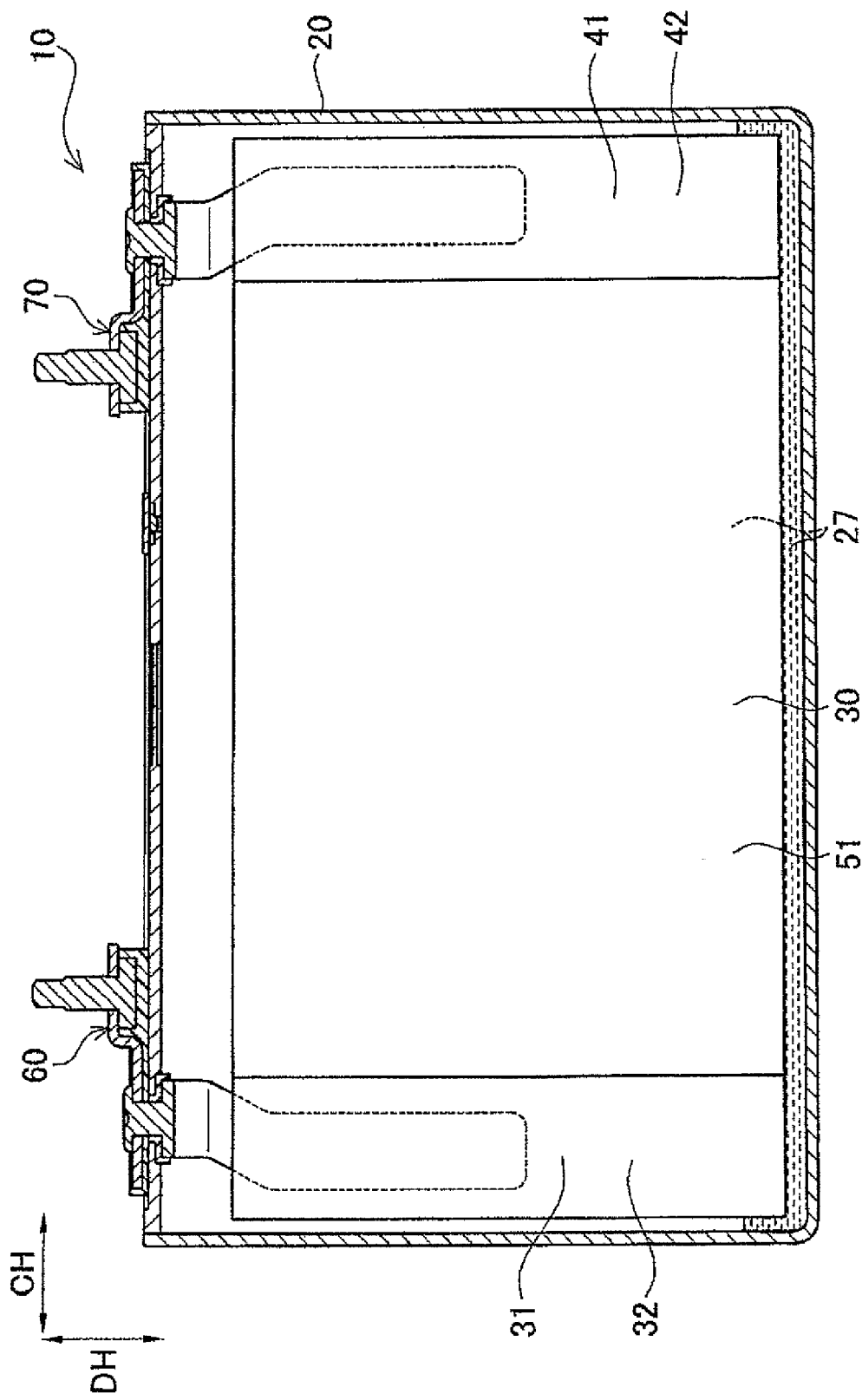
FIG. 3 is a longitudinal sectional view of the single cell according to the example embodiment.
Figure 4:
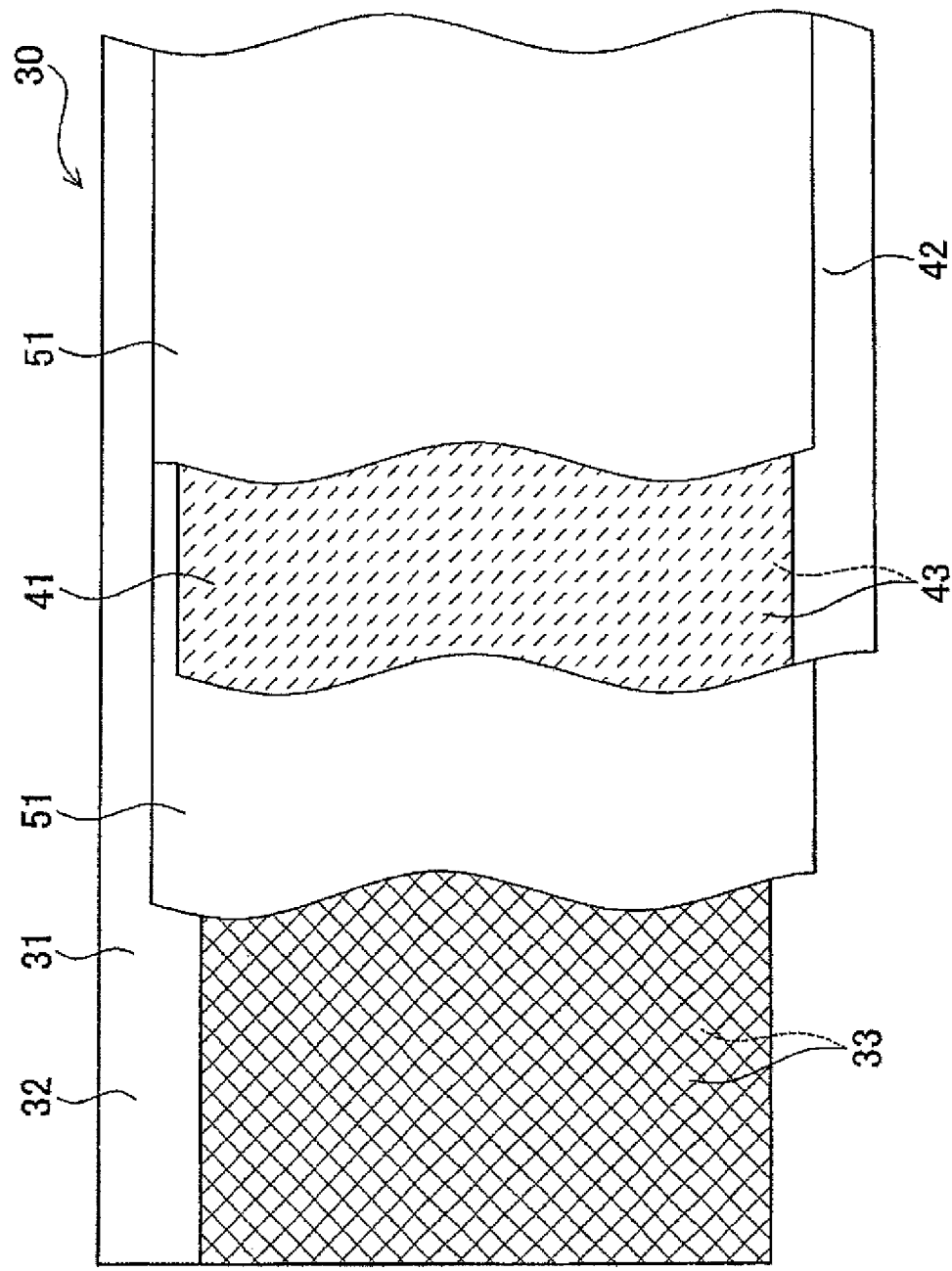
FIG. 4 is a projection view of an electrode body, which shows a positive electrode plate and a negative electrode plate stacked together via a separator, according to the example embodiment.

Hereinafter, example embodiments of the invention will be described with reference to the accompanying drawings. FIG. 1 is a view of a battery pack 100. Also, FIGS. 2 and 3 are views of a single cell 10 that is one of a plurality of single cells 10 that form the battery pack 100, and FIG. 4 is a view of an electrode body 30 that forms the single cell 10. In the description below, a restraining direction EH and a height direction FH of the battery pack 100 are set as the directions shown in FIG. 1, and a thickness direction BH, a width direction CH, and a height direction DH of the single cell 10 are set as the directions shown in FIGS. 1 to 3. This battery pack 100 is mounted in a vehicle such as a hybrid vehicle or an electric vehicle. This battery pack 100 includes a plurality of the single cells 10 arranged in a line, a plurality of spacers 130, one interposed between adjacent single cells 10, and a restraining member 110 that restrains, while pressing against, the single cells 10 and the spacers 130. Hereinafter, the single cells 10 and the spacers 130 may be referred to in the singular for the sake of simplicity.

First, the single cell 10 will be described (see FIGS. 2 and 3). This single cell 10 is a lithium-ion secondary battery and is a square type sealed battery. The single cell 10 includes a rectangular parallelepiped battery case 20, a flat rolled electrode body 30 housed inside the battery case 20, and a positive electrode terminal 60 and a negative electrode terminal 70 supported by the battery case 20, and the like. Also, a non-aqueous electrolyte 27 is held inside the battery case 20.

Of these, the electrode body 30 is housed in the battery case 20 in a state in which an axis (i.e., a winding axis) of the electrode body 30 is on its side parallel to the width direction CH of the single cell 10 (see FIG. 3). This electrode body 30 is such that a strip-shaped positive electrode plate 31 and a strip-shaped negative electrode plate 41 are stacked together via two strip-shaped separators 51 that are made of a porous resin membrane (see FIG. 4), rolled around an axis, and compressed in a flat shape. A portion of the positive electrode plate 31 in the width direction forms a spiral shape that protrudes on one side (the left in FIG. 3 and up in FIG. 4) in one direction in the axial direction from the separator 51, and is connected (welded) to the positive electrode terminal 60. Also, a portion of the negative electrode plate 41 in the width direction forms a spiral shape that protrudes on the other side (the right in FIG. 3 and down in FIG. 4), and is connected (welded) to the negative electrode terminal 70.

The positive electrode plate (i.e., the electrode plate) 31 has a strip-shaped positive electrode foil 32 made of aluminum as a core. A positive-electrode active material layer 33 that extends in a strip-shape in a longitudinal direction (i.e., the left-right direction in FIG. 4) is formed in on portion (below in FIG. 4), in the width direction (the vertical direction in FIG. 4), of both the front and back surfaces of this positive electrode foil 32. Also, the negative electrode plate (i.e., the electrode plate) 41 has a strip-shaped negative electrode foil (electrode foil) 42 made of copper as a core. A negative-electrode active material layer 43 that extends in a strip-shape in the longitudinal direction (i.e., the left-right direction in FIG. 4) is formed on portion (above in FIG. 4), in the width direction (the vertical direction in FIG. 4), of both the front and back surfaces of this negative electrode foil 42.

The plurality of single cells 10 are arranged in a line in the thickness direction BH of the single cells 10 (i.e., the left-right direction in FIG. 1) via the spacers 130 (i.e., with a spacer 130 between adjacent single cells 10). Adjacent single cells 10 are electrically connected in series by a bus bar, not shown. In FIG. 1, the positive electrode terminal 60 and the negative electrode terminal 70 (see FIGS. 2 and 3) of the single cell 10 are omitted.

The spacer 130 is made of resin. The spacer 130 has a rectangular plate-shaped plate portion 131 and a plurality of protruding portions 133 protruding from this plate portion 131, and thus has a comb-shaped cross-section. The plate portion 131 of this spacer 130 abuts against one of two adjacent single cells 10, and the protruding portions 133 abut against the other adjacent single cell 10. As a result, a plurality of cooling paths RK through which a cooling medium flows are formed in a direction orthogonal to the restraining direction EH and the height direction FH of the battery pack 100

(i.e., a direction orthogonal to the surface of the paper on which FIG. 1 is drawn), between the other single cells 10 and the spacer 130.

The single cells 10 and the spacers 130 that are arranged lined up alternately are restrained in a state pressed in the thickness direction BH of the single cells 10. As a result, the electrode bodies 30 that are housed in the single cells 10 are also pushed against, so the positive electrode plates 31, the negative electrode plates 41, and the separators 51 are pushed in the thickness direction AH. The restraining member 110 includes two end plates 111, four restraining bands 113, and eight fastening bolts 115. The end plates 111 have a rectangular shape, and are arranged one on each side of the lined up single cells 10 and the spacers 130. These end plates 111 abut against the single cells 10 positioned on both ends, from among the single cells 10 and the spacers 130 that are lined up. More specifically, each end plate 111 abuts against the entire surface of a wide surface 20c that faces the outside of the corresponding single cell 10 that is positioned one on both ends.

The restraining bands 113 have cylindrical shapes and are arranged between the two end plates 111, connecting the end plates 111 together. The fastening bolts 115 are inserted into through-holes, not shown, provided in the end plates 111, and fasten end portions 113t of the restraining bands 113 to the end plates 111. As a result, the plurality of single cells 10 and spacers 130 arranged between the two end plates 111 are restrained in a state pressed in the restraining direction EH.

Here, in the battery pack 100 in the complete state, the highest maximum contact pressure of the pressure that is applied in the thickness direction AH of the positive electrode plate 31, the negative electrode plate 41, and the separator 51 by the restraining member 110 and distributed in the spreading direction of the positive electrode plate 31, the negative electrode plate 41, and the separator 51, is the maximum restraint contact pressure Pd. In this example embodiment, this maximum restraint contact pressure Pd is generated at portions that are pressed on by the protruding portions 133 of the spacer 130. The maximum restraint contact pressure is 0.3 to 15.5 MPa, inclusive (more specifically, Pd=6.2 MPa).

Continuing on, a manufacturing method of the battery pack 100 will be described. First, a plurality of the single cells 10 are prepared. Each of these single cells 10 may be tested individually for an internal short beforehand. Doing so results in a short-circuit test being performed twice, combined with a short-circuit test in a short-circuit testing process that will be described later, so a single cell 10 in which an internal short has occurred is able to be more reliably removed.

Figure 5:
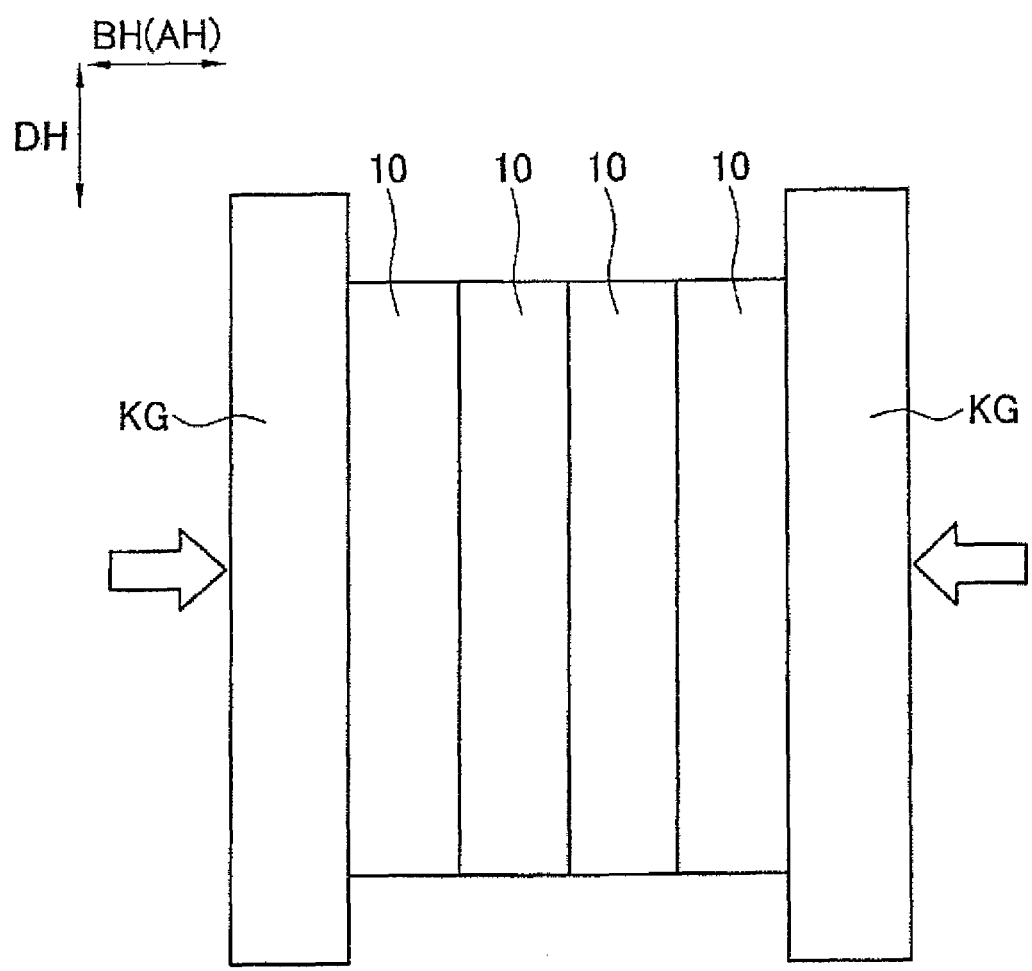
FIG. 5 is an explanatory view showing single cells being compressed in a thickness direction.

Next, a restraining process is performed. First, the plurality of the single cells 10 are stacked together in the thickness direction BH of the single cells 10 (see FIG. 5). Then these single cells 10 are compressed in the thickness direction BH of the single cells 10, and the positive electrode plate 31, the negative electrode plate 41, and the separator 51 are compressed in the thickness direction AH thereof at a maximum compression contact pressure Pc. More specifically, as shown in FIG. 5, the lined-up single cells 10 are sandwiched by press molds KG from both sides, and the single cells 10 are compressed in the thickness direction BH (thickness direction AH) at the maximum compression contact pressure Pc. This maximum compression contact pressure Pc is a value that is slightly greater than the maximum restraint contact pressure Pd described above, and satisfies 0.8≤Pd/Pc≤0.9. In this example embodiment, Pd=0.85 Pc (Pc=1.18 Pd), and more specifically, the maximum compression contact pressure Pc is 7.3 MPa.

As will be described later, this compression may be the maximum restraint contact pressure Pd after first being the maximum compression contact pressure Pc when the plurality of the single cells 10 and spacers 130 are arranged alternately, the end plates 111 of the restraining member 110 are arranged on both sides, and the plurality of the single cells 10, the spacers 130 and the end plates 111 are restrained (see FIG. 1). Alternatively, this compression may be performed for each individual single cell 10.

Then, using the restraining member 110 of the battery pack 100, these single cells 10 are restrained at the maximum restraint contact pressure Pd in the thickness direction BH (the thickness direction AH of the positive electrode plate 31 and the like) of the single cells 10. That is, a plurality of the single cells 10 and spacers 130 are arranged lined up alternately, and the end plates 111 are arranged on both ends (see FIG. 1). Then the end plates 111 are connected together using the restraining bands 113 and the fastening bolts 115, and the single cells 10 and the spacers 130 are restrained at the maximum restraint contact pressure Pd (specifically, Pd=6.2 MPa) in the restraining direction (EH (i.e., the thickness direction BH of the single cell 10 and the thickness direction AH of the positive electrode plate 31 and the like).

Next in a standing process, the single cells 10 that are restrained by the restraining member 110 at the maximum restraint contact pressure Pd are left standing in an electrically open state. More specifically, the single cells 10 that are restrained by the restraining member 110 are left standing for 3.0 days in an environment of 25° C.

Next, in a short-circuit testing process, the single cells 10 that are restrained by the restraining member 110 at the maximum restraint contact pressure Pd are tested for an internal short. More specifically, a battery voltage Vb of each of the single cells 10 that are restrained by the restraining member 110 is measured, and a battery voltage difference ΔV (=Va−Vb) between a battery voltage Va measured beforehand before the standing process and the battery voltage Vb is obtained. If this battery voltage difference ΔV is equal to or less than a predetermined threshold value Vc (ΔV≤Vc), it is determined that the single cell 10 is good with no internal short. On the other hand, if the battery voltage difference ΔV is greater than the threshold value Vc (ΔV>Vc), it is determined that there is an internal short in the single cell 10, and the single cell 10 is removed (or more specifically, discarded) as a defective cell.

Then the single cells 10 are electrically connected together in series using a bus bar, not shown. Thus, the battery pack 100 is complete. In this example embodiment, a test for an internal short is performed on each individual single cell 10 while the single cells 10 are restrained by the restraining member 110. However, a test for an internal short may also be performed on each single cell 10 when the plurality of single cells 10 are electrically connected together in series (i.e., after the battery pack 100 is complete).

(Test Results)

Figure 6:
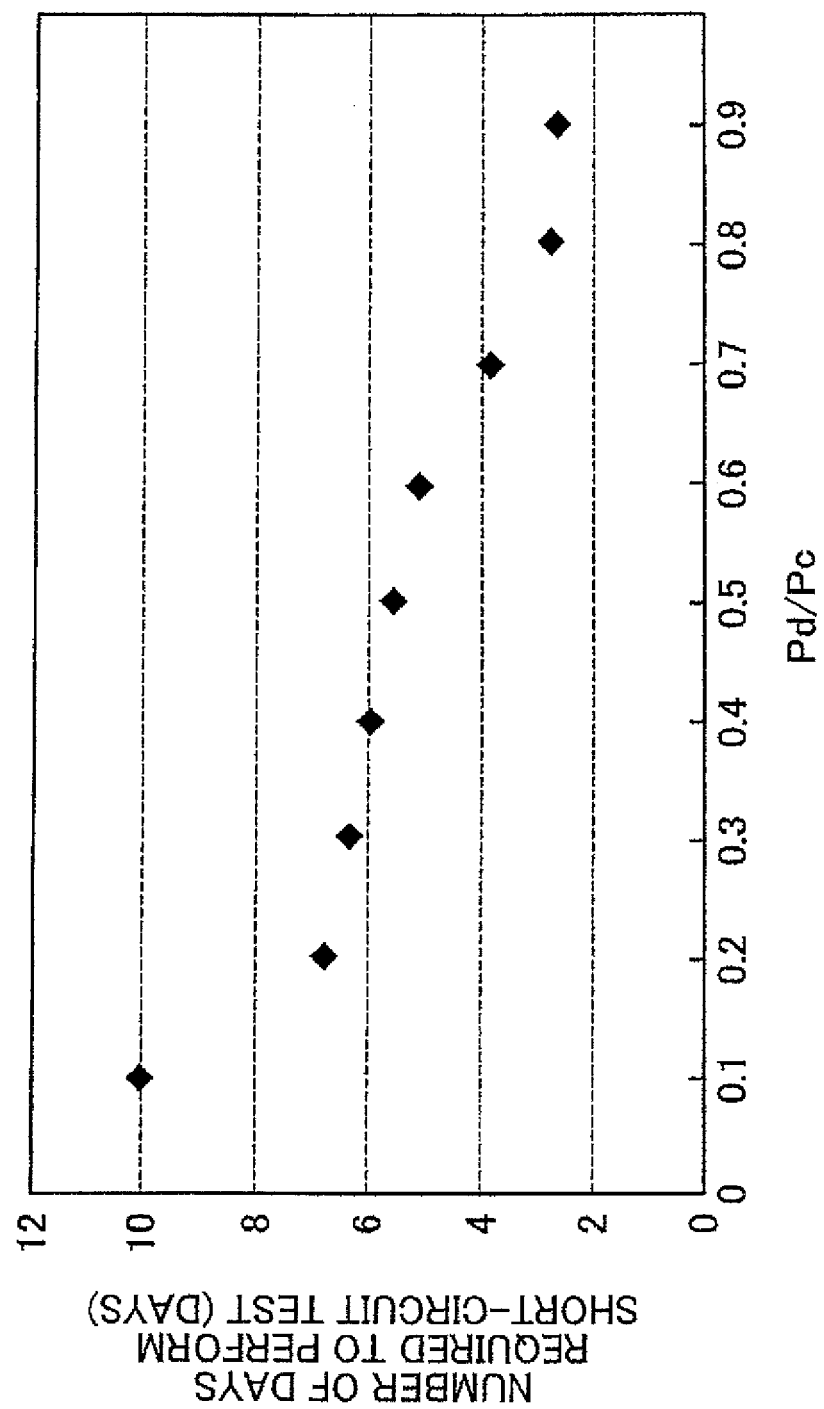
FIG. 6 is a graph illustrating a relationship between a value of a ratio Pd/Pc of a maximum restraint contact pressure Pd to a maximum compression contact pressure Pc, and the number of days that it takes to perform a short-circuit test.

Continuing on, the results of a test performed to evaluate the effect of the manufacturing method of the battery pack 100 according to the example embodiment will be described. The ratio Pd/Pc of the maximum restraint contact pressure Pd to the maximum compression contact pressure Pc was changed varyingly within a range of 0.1 to 0.9, inclusive. Aside from this, the processes up to the short-circuit testing process were performed just as they are in the example embodiment. Also, in the short-circuit testing process, the number of days required to check for an internal short (i.e., the number of standing days in the standing process) were examined. The results are shown in FIG. 6. In this test, the maximum compression contact pressure Pc is fixed at 7.3 MPa, just as in the example embodiment, and the value of the ratio Pd/Pc was changed between 0.1 and 0.9, inclusive, by changing the value of the maximum restraint contact pressure Pd.

As is evident from FIG. 6, the number of days required to perform the short-circuit test (i.e., the number of standing days) is fewer the larger the value of the ratio Pd/Pc of the maximum restraint contact pressure Pd to the maximum compression contact pressure Pc is. It is evident that when the Pd/Pc is 0.8 or the Pd/Pc is 0.9, the number of days required to perform the short-circuit test (i.e., the number of standing days) is particularly few, at 3.0 days or less.

The reason for this is as follows. That is, when a single cell is compressed at the maximum compression contact pressure Pc that is sufficiently large compared to the maximum restraint contact pressure Pd, more specifically, when Pc>1.25 Pd (Pd/Pc<0.8), a short will occur even in a single cell in which a short will not occur in the future because the only conductive foreign matter that is present is small if only the maximum restraint contact pressure Pd continues to be applied. Moreover, a short that occurs due to this small foreign matter will occur as a result of the maximum restraint contact pressure Pd being continuously applied for an extended period of time after the maximum compression contact pressure Pc is applied. Therefore, an attempt to remove this single cell will inevitably increase the period of time that it takes to perform the short-circuit test (i.e., the number of standing days).

On the other hand, if the maximum compression contact pressure Pc is limited to being slightly higher than the maximum restraint contact pressure Pd, or more specifically, if the maximum compression contact pressure Pc is such that 1.11 Pd≤Pc≤1.25 Pd (0.8≤Pd/Pc≤0.9), then a short caused by small foreign matter will not occur even if the maximum restraint contact pressure Pd continues to be applied after the single cells 10 have been compressed at the maximum compression contact pressure Pc. On the other hand, a short due to large foreign matter can be induced in a short period of time by applying the maximum compression contact pressure Pc of Pc≥1.11 Pd (Pd/Pc≤0.9). Therefore, the period of time that it takes to perform the short-circuit test (i.e., the number of standing days) is conceivably able to be reduced.

In this test, as described above, the maximum compression contact pressure Pc is fixed at a certain value, and the value of the ratio Pd/Pc is changed by changing the value of the maximum restraint contact pressure Pd. However, a similar effect is also able to be obtained if the value of the maximum compression contact pressure Pc is changed. That is, when the ratio Pd/Pc of the maximum restraint contact pressure Pd to the maximum compression contact pressure Pc is set such that 0.8≤Pd/Pc≤0.9, the number of days that it take to perform the short-circuit test (i.e., the number of standing days) is able to be notably reduced.

As described above, in the manufacturing method of the battery pack 100, after the single cells 10 have been compressed in the thickness direction BH thereof (i.e., the thickness direction AH of the positive electrode plate 31 and the like) at the maximum compression contact pressure Pc that is slightly higher than the maximum restraint contact pressure Pd that satisfies 0.8≤Pd/Pc≤0.9, with respect to the maximum restraint contact pressure Pd of the battery pack 100 in the complete state, the single cells 10 are restrained at the maximum restraint contact pressure Pd and tested for an internal short.

The single cells 10 are able to be sufficiently compressed beforehand by setting the maximum compression contact pressure Pc to a value larger than the maximum restraint contact pressure Pd that satisfies Pd/Pc≤0.9, i.e., Pc≥1.11 Pd. Therefore, workability when assembling the battery pack 100 is able to be improved at times such as when restraining the single cells 10 with the restraining member 110. In addition, with a single cell 10 in which large conductive foreign matter that may cause a short in the future is in the electrode body 30, this foreign matter passes through the separator 51 when the single cell 10 is compressed, and the positive electrode plate 31 and the negative electrode plate 41 become electrically connected via this foreign matter. Consequently, a short occurs. Therefore, the number of days for which the single cells 10 are left standing in the standing process is able to be reduced, so a single cell 10 in which a short has occurred can be differentiated in a short period of time and removed.

On the other hand, for a single cell 10 in which there is only small foreign matter that will not cause a short in the future if only the maximum restraint contact pressure Pd continues to be applied, the small foreign matter can be inhibited from damaging the separator 51 when the single cell 10 is compressed, by setting an upper limit, with the maximum compression contact pressure Pc being a value that satisfies Pd/Pc≥0.8, i.e., Pc≤1.25 Pd. Even if the maximum restraint contact pressure Pd continues to be applied in the completed battery pack 100, a short is able to be prevented from occurring due to small foreign matter passing through the separator 51. Therefore, there is no need to perform a short-circuit test for an extended period of time after the single cells 10 have been restrained at the maximum restraint contact pressure Pd.

In this way, the manufacturing method of the battery pack 100 makes it possible to both improve workability when assembling a battery pack, and differentiate in a short period of time only those single cells 10 in which a short may occur in the future due to conductive foreign matter and remove them. More specifically, a single cell 10 in which a short may occur in the future due to conductive foreign matter is able to be differentiated and removed even if the number of standing days is reduced to 1.5 to 3.0 days, inclusive. In a battery pack 100 in which the maximum restraint contact pressure Pd is 0.3 to 15.5 MPa, inclusive, by applying the maximum compression contact pressure Pc that is slightly higher than this maximum restraint contact pressure Pd, an effect is able to be suitably obtained in which workability when assembling the battery pack is able to be improved, and only a single cell 10 in which a short may occur in the future due to conductive foreign matter is able to be differentiated by a short-circuit test in a short period of time.

While the invention has been described with reference to example embodiments thereof, it should be understood that the invention is not limited to the example embodiments. That is, the invention may be carried out in modes that have been suitably modified without departing from the scope thereof. For example, in the restraining process of the example embodiment, the single cells 10 are restrained at the maximum restraint contact pressure Pd using the restraining member 110 of the battery pack 100, but the single cells 10 may also be restrained at the maximum restraint contact pressure Pd using another restraining jig other than the restraining member 110 of the battery pack 100. In this case, the standing process and the short-circuit testing process are performed while the single cells are restrained by this restraining jig.

What is claimed is:

1. A manufacturing method of a battery pack that includes a plurality of single cells, each of which has an electrode body that includes an electrode plate and a separator, and a restraining member that restrains the single cells, the manufacturing method comprising:

a restraining process of restraining the single cells in a thickness direction of the electrode plate and the separator at a maximum restraint contact pressure Pd, after compressing the single cells in the thickness direction at a maximum compression contact pressure Pc that satisfies 0.8≤Pd/Pc≤0.9, when a highest maximum contact pressure, of a pressure that is applied in the thickness direction by the restraining member and distributed in a spreading direction of the electrode plate and the separator, is set as the maximum restraint contact pressure Pd, in the battery pack in a complete state;

a standing process of leaving the single cells that are in a state restrained at the maximum restraint contact pressure Pd to stand for a predetermined number of days in an electrically open state after the restraining process; and a short-circuit testing process of testing for an internal short in the single cells left standing in the state restrained at the maximum restraint contact pressure Pd after the standing process.

2. The manufacturing method according to claim 1, wherein the number of days for which the single cells are left standing is 1.5 to 3.0 days, inclusive.

3. The manufacturing method according to claim 1, wherein the maximum restraint contact pressure is 0.3 to 15.5 MPa, inclusive.

4. The manufacturing method according to claim 1, wherein it is determined that there is an internal short when a difference between a battery voltage measured before the single cells are electrically opened and a battery voltage measured after the predetermined number of days for which the single cells are left standing is larger than a predetermined threshold value.

* * * * *